United States Patent [19]

Lang et al.

[11] Patent Number: 5,040,188
[45] Date of Patent: Aug. 13, 1991

[54] SEMICONDUCTOR LASER

[75] Inventors: Robert Lang, Pasadena, Calif.; Albrecht Mozer, Bietigheim, Fed. Rep. of Germany

[73] Assignee: Alcatel N. V., Amsterdam, Netherlands

[21] Appl. No.: 508,722

[22] Filed: Apr. 16, 1990

[30] Foreign Application Priority Data

May 12, 1989 [DE] Fed. Rep. of Germany ....... 3915625

[51] Int. Cl.$^5$ ................................................ H01S 3/08
[52] U.S. Cl. ...................................... 372/96; 372/45
[58] Field of Search ..................................... 372/96, 45

[56] References Cited

U.S. PATENT DOCUMENTS

| 1,101,845 | 7/1978 | Russer | 372/96 |
| 4,573,158 | 2/1986 | Utaka et al. | 372/96 |
| 4,775,980 | 10/1988 | Chinone et al. | 372/96 |
| 4,847,857 | 7/1989 | Ohkura | 372/96 |

FOREIGN PATENT DOCUMENTS 0152086 8/1985 Japan ................................. 372/96

Primary Examiner—Georgia Epps
Attorney, Agent, or Firm—Spencer & Frank

[57] ABSTRACT

A switchable DFB (distributed feedback) laser which includes a waveguide layer having an impressed diffraction grating composed of two or more superposed subgratings having different respective grating constants. The diffraction grating is either frequency modulated (FIG. 3a) or amplitude modulated (FIG. 3b) or is a mixed form of these two types of modulation. Each subgrating can be employed to generate an emission wavelength that is a function of the grating period. By changing the temperature or changing the injection current, the effective index of refraction of the laser is changed, thus enabling the setting of an emission wavelength which is a function of the modulated diffraction grating. The switchable DFB laser according to the present invention may be employed for optical data transmission and particularly in narrowband wavelength multiplex operation.

12 Claims, 1 Drawing Sheet

SEMICONDUCTOR LASER

CROSS REFERENCE TO RELATED APPLICATION

This application claims the priority of Application Ser. No. P 39 15 625.7, filed May 12, 1989, in the Federal Republic of Germany, the subject matter of which is incorporated herein by reference.

BACKGROUND OF THE INVENTION

The present invention relates to a semiconductor laser having a multilayer structure and more particularly a semiconductor laser having an interface between two layers which is configured as a diffraction grating.

Such semiconductor lasers are known as DFB (distributed feedback) or DBR (distributed Bragg reflector) lasers and are disclosed in European Pat. 0,173,269. Such lasers have a wavy interface between two layers so as to form a grating at which light emitted upon stimulation is diffracted in such a way that first order observation causes light to propagate at an emission wavelength $\lambda 0$ which corresponds to twice the grating period.

The difference between known DFB lasers and a DBR lasers is that in the DFB laser the wavy interface lies between the laser active layer and a waveguide layer. In the DBR laser the wavy interface follows the laser-active layer between the waveguide layer and another layer having a lower refractive index. The prior art DFB and DBR lasers emit extremely narrow-banded light of a single longitudinal mode. Therefore, these lasers are suitable for optically coherent data transmission as well as for optical data transmission at high bit rates over long paths.

The prior art DFB and DBR lasers have the drawback that they can be tuned only over a very narrow range, for example up to $\Delta\lambda=2$ nm and therefore can be used only conditionally for wavelength multiplex operation. Tuning is effected by increasing the free charge carrier density in the laser-active layer or by a change in temperature.

SUMMARY OF THE INVENTION

It is therefore an object of the present invention to provide a narrowband monomode semiconductor laser which is able to emit light over a larger wavelength range.

This is accomplished by a semiconductor laser having a multiple layer structure and a interface between the waveguide layer and an adjacent layer configured as a diffraction grating, the diffraction grating being composed of at least two subgratings.

DETAILED DESCRIPTION OF THE PREFERRED EMBODIMENTS

Figure 1:
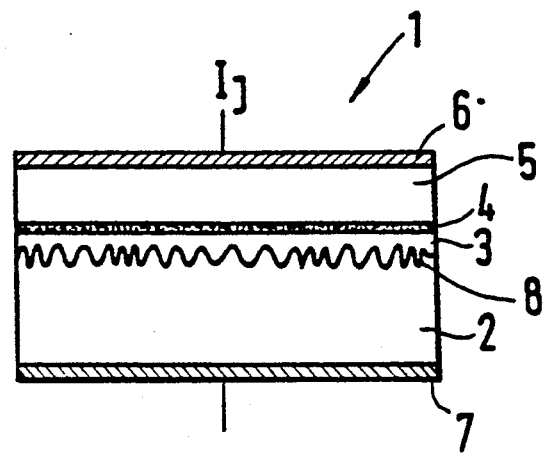
FIG. 1 is a schematic sectional view of a switchable DFB laser.

FIG. 1 is a schematic sectional view of a first embodiment of a DFB (distributed feedback) laser 1 according to the present invention. A waveguide layer 3 adjacent a laser-active layer 4 is disposed on a substrate 2. On laser-active layer 4 there is a bordering layer 5 which is connected with an electrode 6. A second electrode 7 is disposed on the underside of substrate 2. The interface between substrate 2 and waveguide layer 3 is wavy so that the underside of the waveguide layer 3 exhibits a diffraction grating 8.

Figure 3A:
FIGS. 3a and 3b depict possibilities of modulation of two gratings.

The diffraction grating 8 is composed of two or more superposed subgratings having different respective grating constants. FIG. 3a shows one possible form of a diffraction grating 8 which is composed of two subgratings. The grating peaks are here shown schematically as rectangular teeth. This form is called frequency modulated superposition of subgratings.

In a possible manufacturing process for such a diffraction grating, the one subgrating having a grating constant A1 is first impressed in substrate 2 by holographic illumination and subsequent etching of waveguide layer 3. Thereafter, the same process is repeated for the second subgrating which has a grating constant A2. In principle, additional subgratings having further grating constants could be impressed on diffraction grating 8.

In another manufacturing process, the holographic illumination is effected by repeated exposure of substrate 2 to laser light of different wavelengths and then one-time etching of diffraction grating 8 out of substrate 2.

Figure 3B:

Another form of a diffraction grating 8 is shown in FIG. 3b. This form is called amplitude modulated superposition of subgratings.

Diffraction grating 8 has a first subgrating which has a grating constant A1. A second subgrating having the grating constant A2 is not impressed directly in it but is impressed by way of an envelope of the beat amplitude which results from the superposition of two modes at wavelengths $\lambda 1 = 2A1n_{eff}/r$ and $\lambda 2 = 2A2n_{eff}/1$, where r, 1 are integers 1, 2, 3, ... and describe the order of the grating and $n_{eff}$ constitutes the effective index of refraction.

Manufacture occurs according to the above-described process.

If more than two subgratings are impressed into diffraction grating 8, a mixed form of an amplitude and frequency modulated diffraction grating 8 is also possible.

Prior art DFB or DBR laser structures emit only light of a wavelength $\lambda 0$ since their diffraction gratings have a uniform grating constant. The DFB laser 1 according to the present invention can emit light of several wavelengths. The number of different emission wavelengths corresponds to the number of impressed subgratings. DFB laser 1 emits light at a wavelength which is permissible with respect to the grating structure a d lies closest to the maximum of the amplification curve. By changing the injection current $I_J$ the concentration of free charge carriers in laser-active layer 4 is changed and thus also the effective index of refraction. This index is composed of the refractive indexes of the laser-active layer 4 and the waveguide layer 3. The result is that the optical conditions in the laser resonator change and cause DFB laser 1 to emit light of a different emission wavelength $\lambda 2$.

By periodically changing injection current $I_J$, DFB laser 1 can thus be employed in wavelength multiplex operation or, if the injection current $I_J$ remains constant, depending on its magnitude, either the one emission wavelength may be selected or the other.

Figure 2:
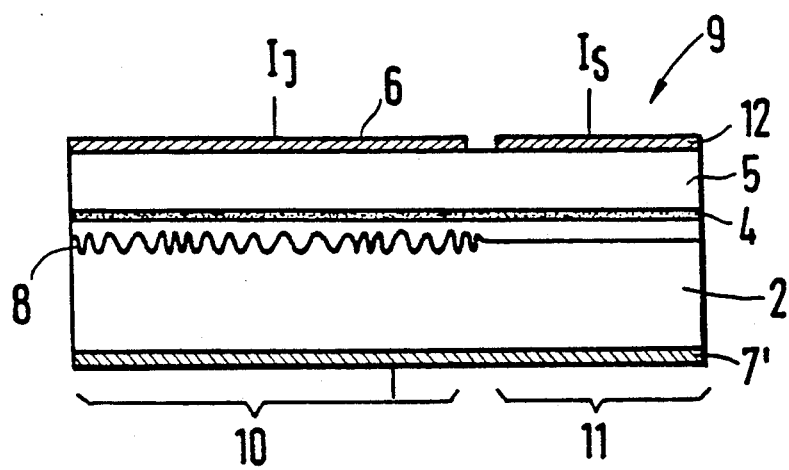
FIG. 2 is a schematic sectional view of a DFB laser and its control region.

FIG. 2 shows as a second embodiment a further DFB laser 9 which has the same layer sequence as the DFB laser 1 of the first embodiment. The portion of DFB laser 9 already disclosed in embodiment 1 will hereinafter be called the amplification region 10 and the part following it the control region 11. Control region 11 differs from amplification region 10 in that no diffraction grating 8 exists between substrate 2 and waveguide layer 3. Moreover, together with the amplification region, this region is provided with an electrode 7' and with its own electrode 12 disposed on adjacent layer 5.

In DFB laser 9, the injection current $I_J$ is injected through electrode 6 and the control current IS through electrode 12. In this case, the change in refractive index takes place only in the control region but, as in DFB laser 1 of embodiment 1, it influences the effective index of refraction and thus causes a change in emission wavelength. This embodiment 2 has the advantage that the injection current $I_J$ and the control current $I_S$ can be injected independently of one another which permits more stable operation of DFB laser 9.

The arrangement of a diffraction grating 8 having several subgratings with different grating constants is not limited to use in DFB lasers but can also be employed in connection with DBR lasers and with lasers whose laser-active layer simultaneously constitutes the waveguide layer.

DFB and DBR lasers are usually non-reflective at their light exit surfaces as provided in the apparatus according to the present invention depending on its intended use. In addition to changing the injection current $I_J$ and the control current IS, respectively, the emission wavelength of the semiconductor lasers according to the present invention can also be varied by changing the temperature. For this purpose, substrate 2 is applied to a controllable heat exchanger (not shown).

DFB lasers 1 and 9 each include an n-InP substrate 2 and an n-InGaAsP waveguide layer 3, an InGaAsP laser-active layer 4 and a p-InP layer 5. Other material combinations may also be employed as long as one layer is laser-active.

It will be understood that the above description of the present invention is susceptible to various modifications, changes and adaptations, and the same are intended to be comprehended within the meaning and range of equivalents of the appended claims.

What is claimed is:

1. In a monomode semiconductor laser having a multilayer structure disposed between first and second electrodes for an injection current and wherein an interface between a waveguide layer and an adjacent layer is configured as a diffraction grating, the improvement wherein the diffraction grating is composed of at least two different superposed subgratings which each have a different grating constant and which each extend over the entire region of said interface disposed between said first and second electrodes, whereby said laser is switchable between at least two different emission wavelengths.

2. A semiconductor laser as defined in claim 1, wherein the subgratings are superposed in an amplitude modulated manner.

3. A semiconductor laser as defined in claim 1, wherein the subgratings are superposed in a frequency modulated manner.

4. A semiconductor laser as defined in claim 1, wherein the subgratings are superposed in a frequency and amplitude modulated manner.

5. A semiconductor laser as defined in claim 1, wherein said emission wavelength is switchable by varying the injection current between said first and second electrodes.

6. A semiconductor laser as defined in claim 1, wherein: said first and second electrodes are disposed on opposing sides of a first portion of said multilayer structure of the semiconductor laser; a third electrode for a control current is disposed adjacent said first electrode on a second portion of said multilayer structure of the semiconductor laser; said second electrode extends over said second portion of said multilayer structure; and, a region of said interface disposed in the second portion of the semiconductor laser is free of said subgratings and acts as a control region for said laser.

7. A semiconductor laser as defined in claim 6, wherein said emission wavelength is switchable by injecting a control current into the control region via said third electrode.

8. A semiconductor laser as defined in claim 1, wherein the laser is coupled with a heat exchanger.

9. A semiconductor laser as defined in claim 1, wherein said emission wavelength is switchable by varying the temperature of the laser.

10. A semiconductor laser as defined in claim 1, wherein optical exit surfaces of said laser are provided with a reflective coating.

11. A semiconductor laser as defined in claim 1 wherein said laser is a distributed feedback laser.

12. A semiconductor laser as defined in claim 1 wherein each of said subgratings is associated with a different emission wavelength of said laser.

* * * * *